United States Patent
Tseng et al.

(10) Patent No.: US 7,441,165 B2
(45) Date of Patent: Oct. 21, 2008

(54) READ-ONLY MEMORY AND OPERATIONAL CONTROL METHOD THEREOF

(75) Inventors: Tsai-Wang Tseng, Taipei (TW); Shih-Chia Kao, Taipei (TW); Shing-Wu Tung, Taipei (TW)

(73) Assignee: Prolific Technology Inc., Nan Kang, Taipei (TW)

( * ) Notice: Subject to any disclaimer, the term of this patent is extended or adjusted under 35 U.S.C. 154(b) by 224 days.

(21) Appl. No.: 11/164,586

(22) Filed: Nov. 29, 2005

(65) Prior Publication Data
US 2006/0206771 A1      Sep. 14, 2006

(30) Foreign Application Priority Data
Jan. 6, 2005     (TW) ............................... 94100370 A

(51) Int. Cl.
*G11C 29/00* (2006.01)
(52) U.S. Cl. .................. 714/718; 714/733; 714/734; 714/732; 714/736; 714/5; 365/201
(58) Field of Classification Search .......... None
See application file for complete search history.

(56) References Cited

U.S. PATENT DOCUMENTS

| | | | | |
|---|---|---|---|---|
| 4,930,129 A | * | 5/1990 | Takahira | 714/766 |
| 5,091,908 A | * | 2/1992 | Zorian | 714/722 |
| 5,631,913 A | * | 5/1997 | Maeda | 714/732 |
| 5,742,616 A | * | 4/1998 | Torreiter et al. | 714/732 |
| 5,761,128 A | * | 6/1998 | Watanabe | 365/189.01 |
| 6,330,297 B1 | * | 12/2001 | Kano et al. | 377/19 |
| 6,876,591 B2 | * | 4/2005 | Gappisch et al. | 365/201 |
| 2004/0193984 A1 | * | 9/2004 | Soundron | 714/733 |
| 2006/0090105 A1 | * | 4/2006 | Woods | 714/718 |

OTHER PUBLICATIONS

"answers.com", Definition of Semiconductor Memories, found on the internet at http://www.answers.com/topic/semiconductor-memory?cat=technology, on Aug. 30, 2007, p. 1 of 1.*

* cited by examiner

*Primary Examiner*—John P Trimmings
(74) *Attorney, Agent, or Firm*—Winston Hsu

(57) ABSTRACT

A read-only memory (ROM) and a related method for controlling operations of the ROM are disclosed. A built-in self-test (BIST) circuit of the ROM verifies system data stored in a system area of a plurality of memory cells of the ROM according to verification data stored in a verification area of the memory cells of the ROM.

6 Claims, 5 Drawing Sheets

READ-ONLY MEMORY AND OPERATIONAL CONTROL METHOD THEREOF

BACKGROUND OF THE INVENTION

1. Field of the Invention

The present invention relates to a read-only memory (ROM) and a method for operational control of the ROM, and more specifically to a ROM having a built-in self-test (BIST) circuit and a method for operational control of the ROM.

2. Description of the Prior Art

In accordance with the rapid development of electronic technologies, many complicated circuits, such as read-only memory (ROM), can be integrated into an integrated circuit (IC) to save space in an electronic apparatus having complicated design. The importance of testing in the manufacture of semiconductor IC chips has escalated because of ever increasing circuit speed and density. Built-in self-test (BIST) is one of the methods known to those of ordinary skill in the art for testing memory arrays on an IC for manufacturing defects.

Please refer to FIG. 1, which is a block diagram of a read-only memory (ROM) 10 with a BIST circuit 11 according to the prior art. The ROM 10 has a BIST circuit 11 and a ROM array 12. The ROM array 12 has a plurality of memory cells. Each of the memory cells of the ROM array 12 is used to store 1-bit binary data, i.e. "0" or "1". The BIST circuit 11 is used to verify the data read from the ROM array 12. The BIST circuit 11 has a BIST controller 14, a compressor 16, and a verification circuit 18. The BIST controller 14 controls the operations of the ROM array 12, the compressor 16, and the verification circuit 18. When the BIST circuit 11 verifies the data Ds read from the ROM array 12, the BIST controller 14 commands the ROM array 12 to output data Ds to the compressor 16. Then, the compressor 16 compresses the output data Ds into compressed data Dc and transmits the compressed data Dc to the verification circuit 18. The verification circuit 18 is a specific circuit that is uniquely designed for the data stored in the ROM array 12. The verification circuit 18 is capable of verifying the data Ds read from the ROM array 12 by checking the compressed data Dc.

However, it is disadvantageous for the manufacturer to modify the data stored in the ROM array 12 because the verification circuit 18 must be re-designed if the data of the ROM array 12 is changed. Please refer to FIG. 2, which is a diagram showing a plurality of photo masks 21-27 for manufacturing the ROM 10 on a wafer 20. The wafer 20 is a silicon substrate, and the ROM 10 is one of the dies formed on the wafer 20. The photo masks 21-27 are used to process semiconductor procedures, such as exposure and etching, to from the circuit of the ROM 10 on the wafer 20. The layouts of the photo masks 21-27 establish the structure of the ROM 10. However, once the data of the ROM 10 is determined, making changes to the data is a difficult, time consuming, and an expensive undertaking. If the original data is faulty or needs to be updated, manufacturing an entirely new ROM is necessary. Hence, all of the photo masks 21-27 may need to be replaced.

SUMMARY OF THE INVENTION

It is therefore a primary objective of the claimed invention to provide a read-only memory (ROM) and a method for operation controlling of the ROM to solve the drawbacks of the prior art.

According to the claimed invention, the method comprises reading system data from a system area of a plurality of memory cells of the ROM, reading verification data from a verification area of the memory cells of the ROM, and verifying the system data according to the verification data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
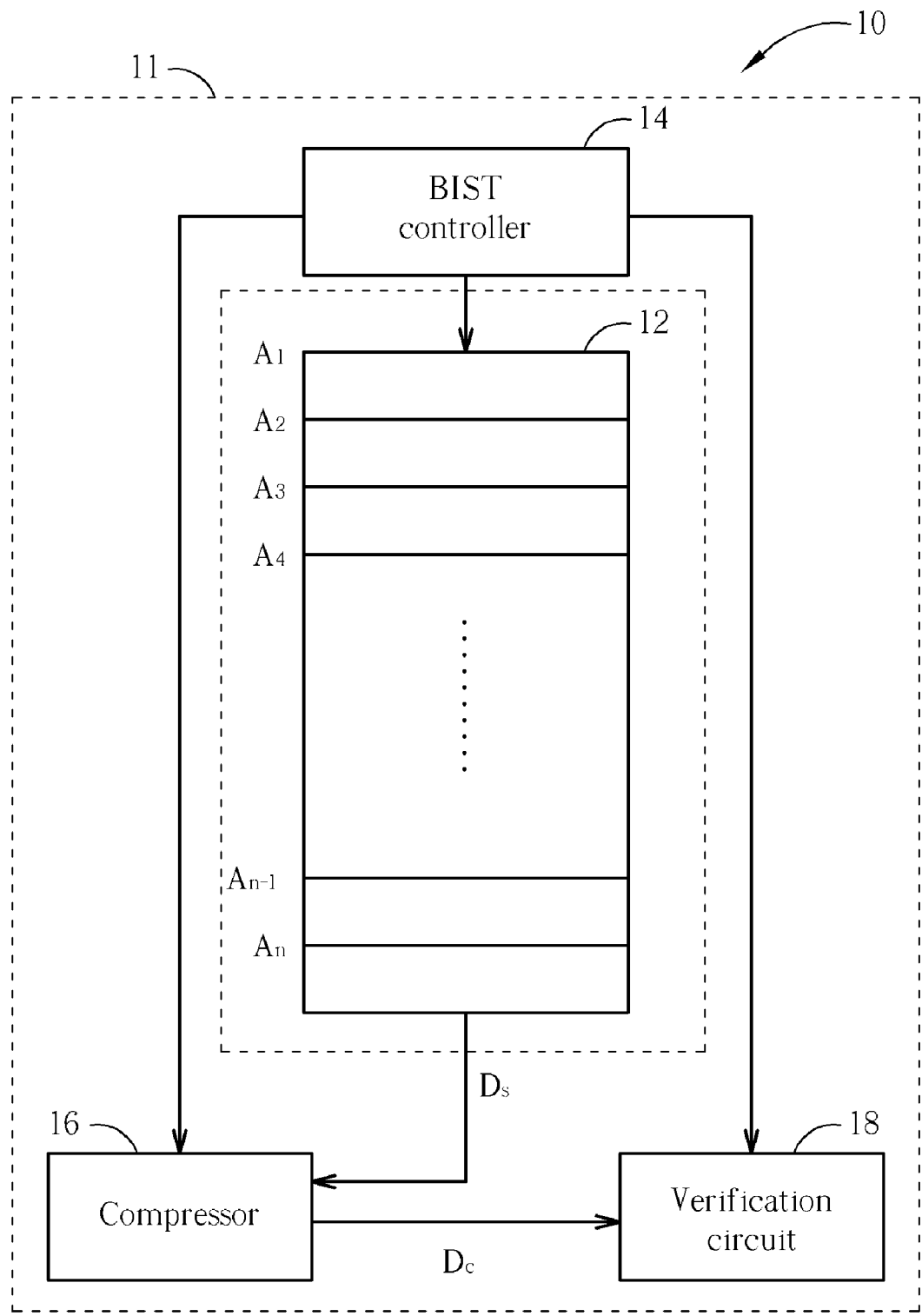
FIG. 1 is a block diagram of a read-only memory (ROM) 10 according to the prior art.
Figure 2:
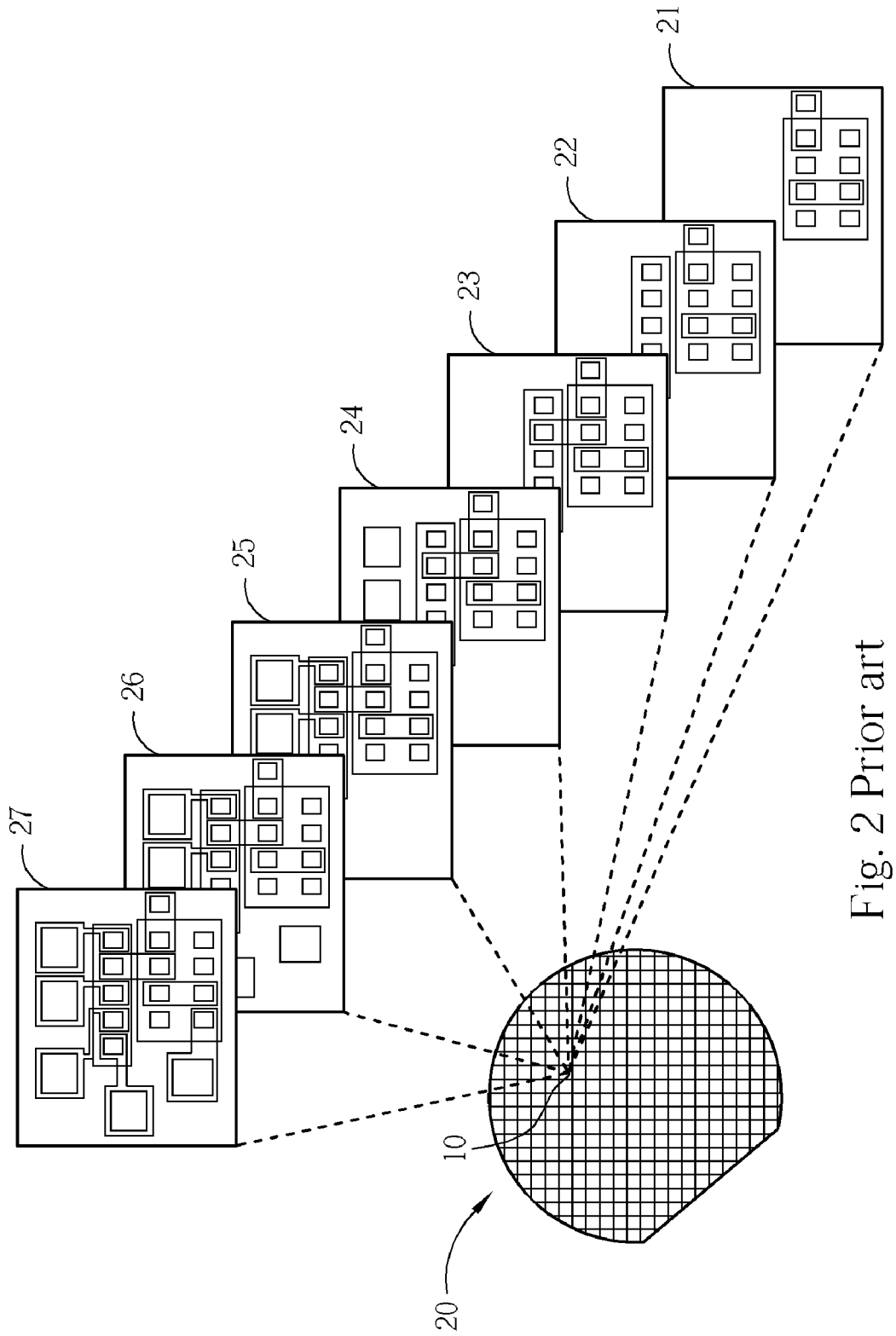
FIG. 2 is a diagram showing a plurality of photo masks to manufacture the ROM shown in FIG. 1 on a wafer.
Figure 3:
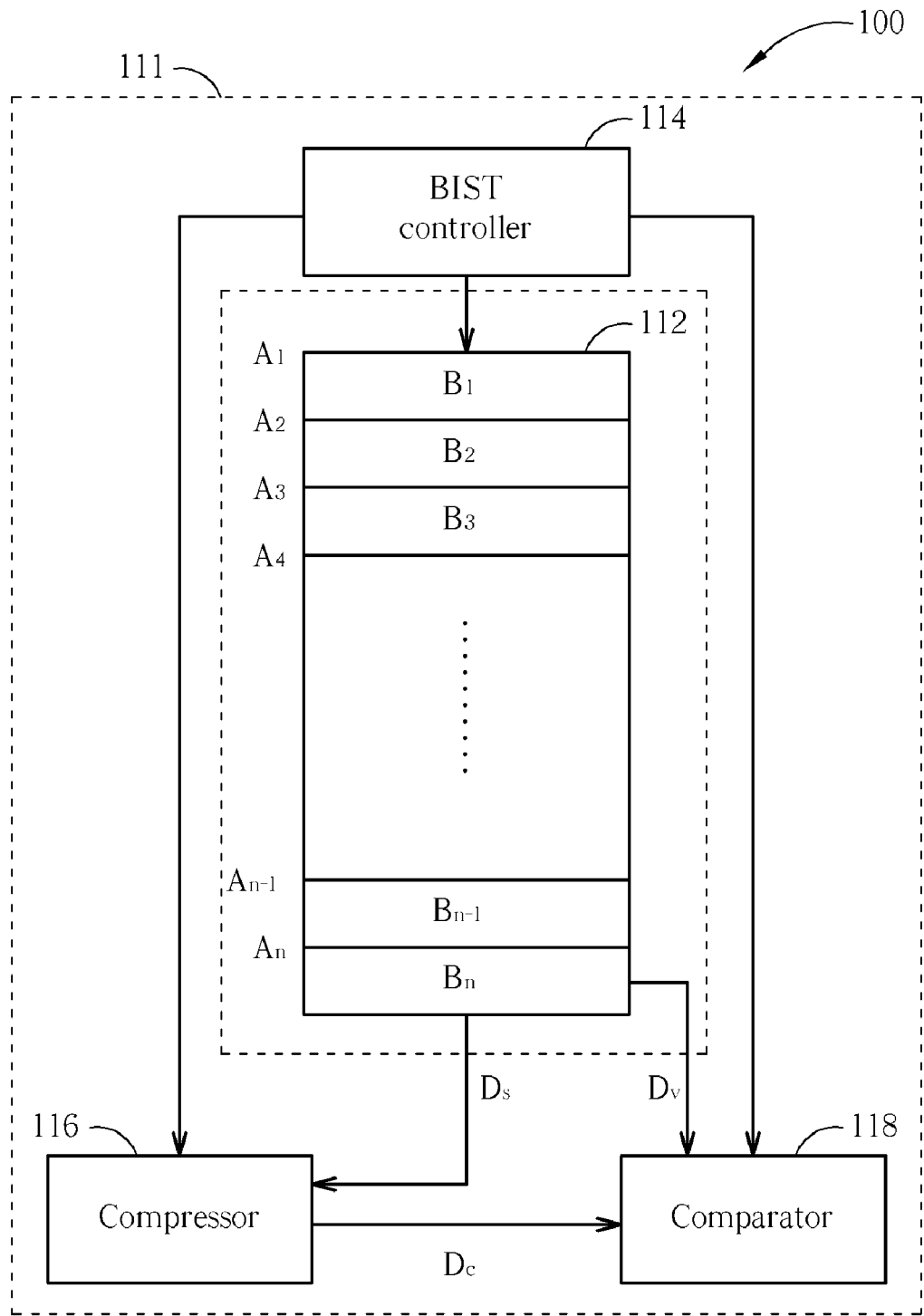
FIG. 3 is a block diagram of a ROM of the preferred embodiment according to the present invention.

Please refer to FIG. 3, which is a block diagram of a ROM 100 of the preferred embodiment according to the present invention. The ROM 100 can be a mask ROM, an erasable programmable read only memory (EPROM), an electrically erasable programmable read-only memory (EEPROM), a one-time programmable (OTP) ROM, or a compile ROM. Similar to the ROM 10, the ROM 100 has a built-in self-test (BIST) circuit 111 and a ROM array 112. The ROM array 112 has a plurality of memory cells. Each of the memory cells of the ROM array 112 can be a transistor, a fuse, or something else for storing 1-bit binary data. The BIST circuit 111 is used to verify the data read from the ROM array 112. The BIST circuit 111 has a BIST controller 114, a compressor 116, and a comparator 118. The BIST controller 114 controls the operations of the ROM array 112, the compressor 116, and the comparator 118. When the BIST circuit 111 verifies the data Ds read from the ROM array 112, the BIST controller 114 commands the ROM array 112 to output data Ds to the compressor 116. Then, the compressor 116 compresses the output data Ds into compressed data Dc and transmits the compressed data Dc to the comparator 118. Unlike the verification circuit 18, the comparator 118 is not uniquely designed for the data stored in the ROM array 112. Actually, the comparator 118 verifies the data stored in a plurality of memory blocks $B_1$-$B_{n-1}$ of the ROM array 112 according to the data of a memory block $B_n$ of the ROM array 112.

Figure 4:
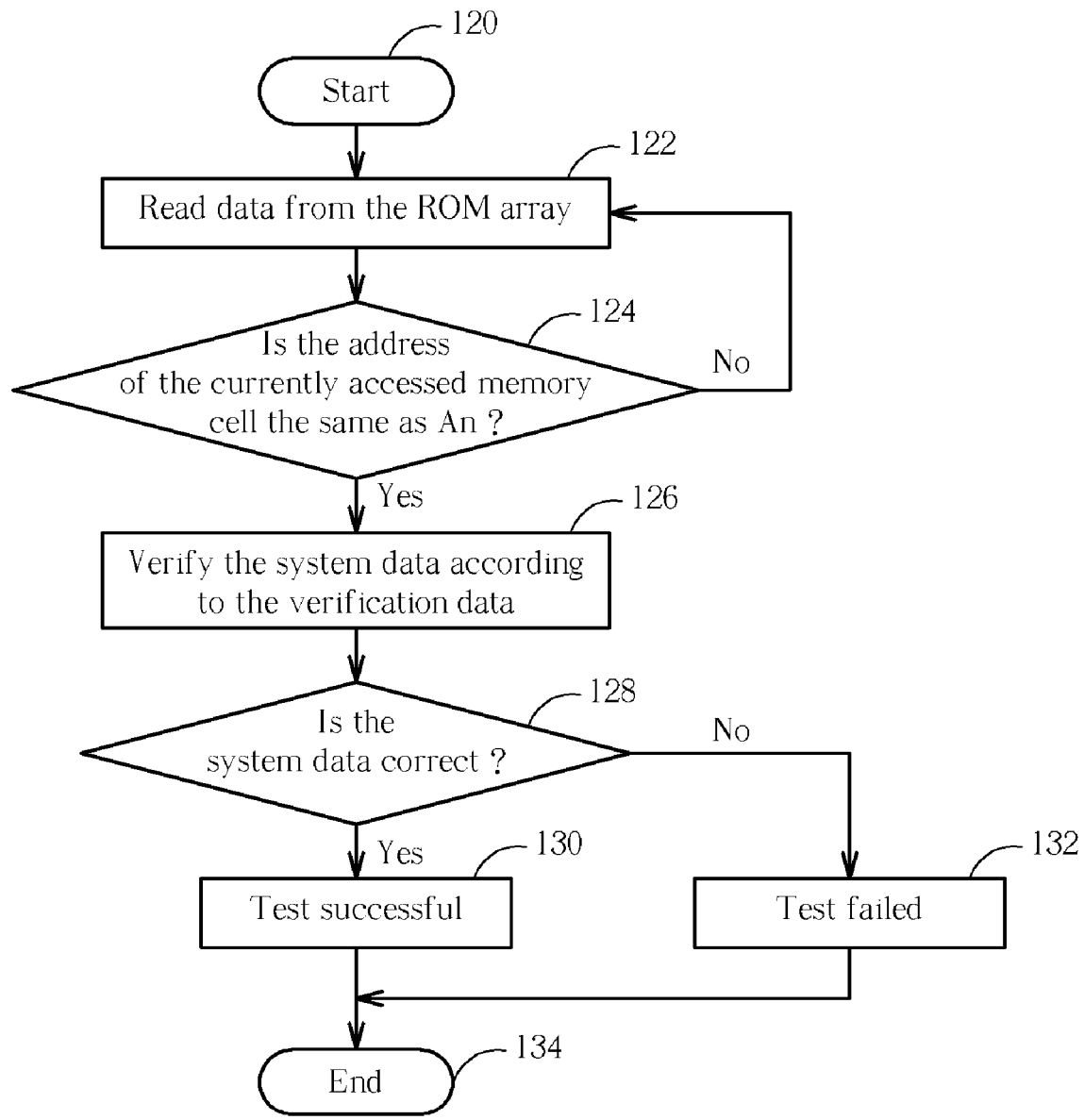
FIG. 4 is a flowchart describing how the BIST circuit shown in FIG. 3 verifies the data of the ROM array.

Please refer to FIGS. 3-4. FIG. 4 is a flowchart describing how the BIST circuit 100 verifies the data of the ROM array 112. The ROM array 112 is divided into a plurality of memory blocks $B_1$-$B_n$. To clearly describe the operations of the ROM 100, the area of the memory blocks $B_1$-$B_{n-1}$ is defined as a system area for storing system data Ds and the area of the memory block $B_n$ is defined as a verification area for storing verification data Dv. The start address of each of the memory blocks is designated in FIG. 3 by $A_1, A_2, A_3, \ldots, A_{n-1}$ or $A_n$. When the ROM 100 operates, the BIST controller 114 commands the ROM array 112 to output data to the compressor 116 (step 122). Before the data of each block $B_1, B_2, \ldots,$ or $B_n$ is transmitted to the compressor 116, the BIST controller 114 determines whether the address of the currently accessed memory cell is the same as the start address An of the memory block $B_n$ (step 124). If the address of the currently accessed memory cell is different from $A_n$, the BIST controller 114 keeps controlling the ROM array 112 to output data (step 122). If the address of the currently accessed memory cell is the same as $A_n$, the BIST controller 114 commands the ROM array 112 to output the data Dv of the memory block $B_n$ to the comparator 118. Then, the comparator 118 verifies the data Ds of the memory blocks $B_1$-$B_{n-1}$ according to the data Dv of the memory block $B_n$ (steps 126, 128). After the comparator finishes verifying the data Ds, the BIST circuit 111 shows the result of the verification test. For example, a green light indicates a successful verification test (step 130), and a red indicates a failed verification test (step 132). Additionally, to reduce the amount of data the comparator 118 processes to verify the data Ds of the memory blocks $B_1$-$B_{n-1}$, the data Ds is beforehand compressed into the compressed data Dc by the compressor 116. The comparator 118, hence, verifies the data Ds of the memory blocks $B_1$-$B_{n-1}$ by comparing the data Dv of the memory block $B_n$ with the compressed data Dc.

Figure 5:
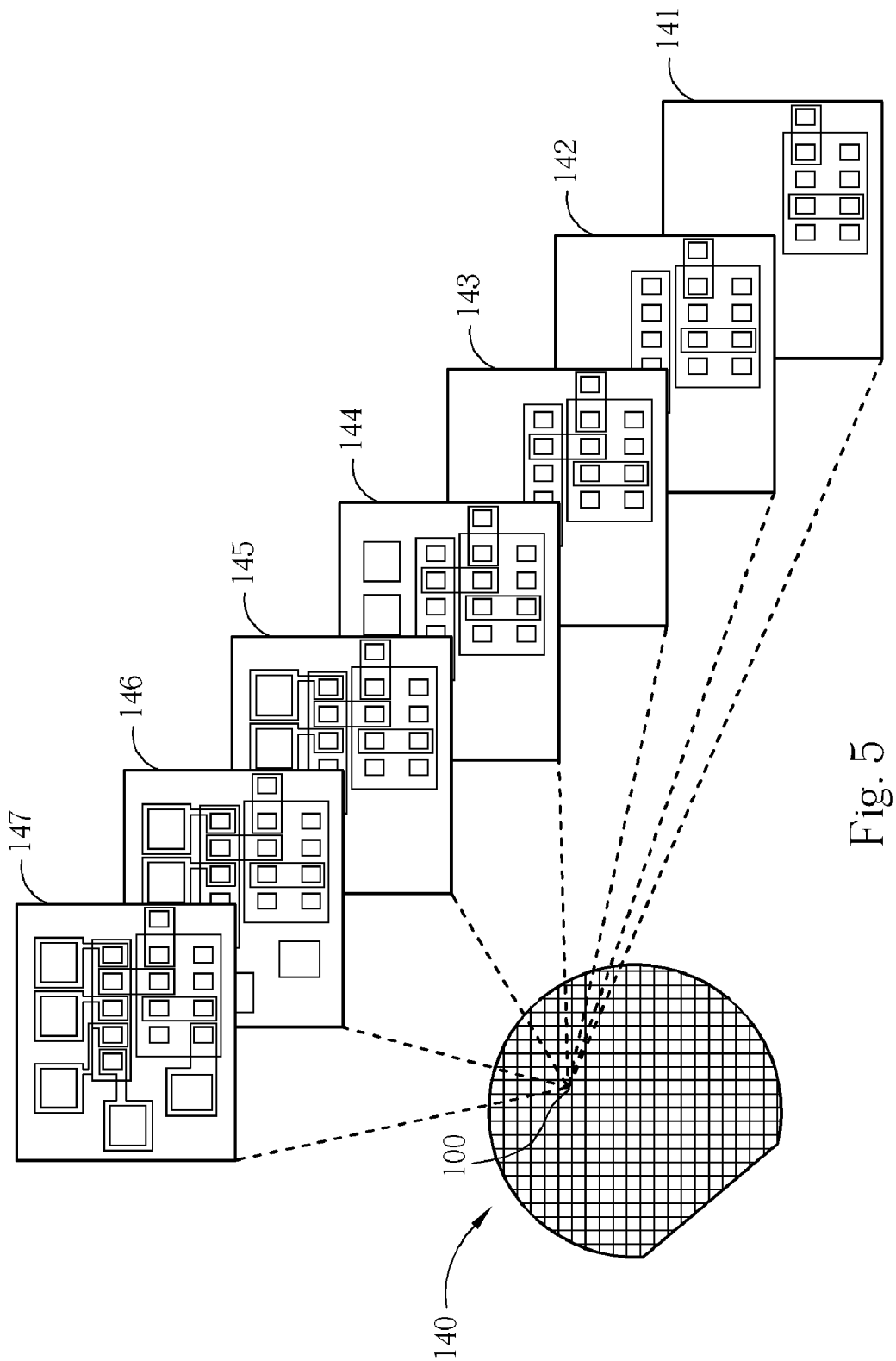
FIG. 5 is a diagram showing a plurality of photo masks to manufacture the ROM shown in FIG. 3 on a wafer.

Please refer to FIG. 5, which is a diagram showing a plurality of photo masks 141-147 to manufacture the ROM 100 shown in FIG. 3 on a wafer 140. The wafer 140 is a silicon substrate 20, and the ROM 100 is one of the dies formed on the wafer 140. The photo masks 141-147 are used to process semiconductor procedures, such as exposure and etching, to from the circuit of the ROM 100 on the wafer 140. The layouts of the photo masks 141-147 determine the structure of the ROM 10. If the original data is faulty or needs to be updated, manufacturing an entirely new ROM 100 is necessary. However, different from the prior art, only the conductor-layer photo mask 147 needs to be replaced, and the other photo masks 141-146 can still be used to manufacture the new ROM. That is because the data of each memory cell of the ROM array 112 is set by the layout of the conductor-layer photo mask 147. For example, when a memory cell is set to be wired to the ground by the conductor-layer photo mask 147, the data of the memory cell is "0". When a memory cell is set to be wired to the power terminal Vdd by the conductor-layer photo mask 147, the data of the memory cell is "1". Therefore, both the system data Ds stored in the memory blocks $B_1$-$B_{n-1}$ and the verification data Dv stored in the memory block $B_n$ of a new ROM can be changed by changing the layout of the conductor-layer photo mask 147. Moreover, because the BIST controller 114, the compressor 116, and the comparator 118 do not need to be modified, the photo mask 141-146 for forming the BIST circuit 111 can be used to manufacture the new ROM. Hence, the cost for manufacturing new ROMs is reduced.

In another embodiment of the present invention, the compressor 116 is omitted. The comparator of the BIST circuit of the ROM directly verifies the system data Ds by comparing the system data Ds with the verification data Dv.

In contrast to the prior art, the present invention provides a read-only memory (ROM) and a method for controlling operations of the ROM in verifying system data according to verification data read from the ROM. If the original data is faulty or needs to be updated, only one of the photo masks for manufacturing the ROM needs to be replaced. Therefore, the cost for manufacturing new ROMs is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling operations of a read-only memory (ROM), the method comprising:
    (a) reading system data from a system area of a plurality of memory cells of the ROM, wherein the system data is permanently stored in the system area of the plurality of memory cells;
    (b) reading verification data from a verification area of the plurality of memory cells of the ROM, wherein the verification data is permanently stored in the verification area of the plurality of memory cells; and
    (c) compressing the system data and comparing the compressed system data with the verification data for verifying the system data.

2. The method of claim 1 wherein step (c) comprises using a built-in self-test (BIST) circuit of the ROM to verify the system data.

3. The method of claim 1 further comprising:
    comparing an address of a currently accessed memory cell with a predetermined address to determine whether the currently accessed memory cell is located in the verification area.

4. The method of claim 1 wherein each of the plurality of memory cells is a fuse.

5. A read-only memory (ROM) comprising:
    a plurality of memory cells divided into a system area for storing system data and a verification area for storing verification data, wherein the system data is permanently stored in the system area of the plurality of memory cells and the verification data is permanently stored in the verification area of the plurality of memory cells; and
    a built-in self-test (BIST) circuit having:
        a compressor for compressing system data that is stored in the system area as compressed system data: and
        a comparator coupled to the verification area for verifying the system data by comparing the compressed system data with the verification data.

6. The ROM of claim 5 wherein each of the plurality of memory cells is a fuse.

* * * * *